United States Patent [19]

Hartley

[11] 4,330,754

[45] May 18, 1982

[54] SOUND AMPLIFIERS

[76] Inventor: Peter Hartley, 198 Brookhill, Sheffield 3, England

[21] Appl. No.: 114,513

[22] Filed: Jan. 23, 1980

[30] Foreign Application Priority Data

Jan. 25, 1979 [GB] United Kingdom ................. 7902683

[51] Int. Cl.³ .......................... H03F 3/26; G10H 1/06
[52] U.S. Cl. ..................................... 330/264; 84/1.11; 330/269
[58] Field of Search ............... 330/149, 264, 269, 276; 84/1.11, 1.16, 1.19, 1.24; 179/1 M

[56] References Cited

U.S. PATENT DOCUMENTS 3,835,409  9/1974  Laub ................................ 330/149 X
4,096,443  6/1978  Gilson ............................. 330/264 X Primary Examiner—James B. Mullins
Attorney, Agent, or Firm—Lowe, King, Price & Becker

[57] ABSTRACT

A transistor amplifier of the invention comprises a low power solid state simulator for a push-pull transformer-coupled vacuum tube power amplifier. The simulator develops overtones and distortion characteristics associated with a vacuum tube power amplifier, thereby producing a vacuum tube sound from the transistor amplifier.

3 Claims, 3 Drawing Figures

SOUND AMPLIFIERS

This invention relates to amplifiers and is concerned with the amplification of sound produced by musical instruments. Although the invention has particular applicability to the amplification of the sound produced by a six-string guitar, it will be understood that the invention is not limited to such application.

Since the advent of the so-called "electric" guitar in which the note produced by a string is converted to a series of electrical impulses by a pick-up on the guitar situated in close proximity to that string, passed through a circuit including an amplifier, and re-converted to the note at a suitable speaker, considerable attention has been given to the amplifier itself, and whereby not only can the pure note be amplified as desired, but also a degree of so-called distortion can be imposed on the note thereby extending considerably the range of sounds available to the musician from a single instrument. At the outset, amplifiers utilising vacuum tubes, e.g., pentode/beam tetrode valves, were produced, and following the development of transistors, transistorized amplifiers were produced, both types currently being in common useage. To those well versed in the art of sound production by electric/electronic means, the sounds and distortion effects of tube amplifiers and transistor amplifiers are readily discernible, each being particularly suited to different styles of music. Transistor amplifiers have considerable advantages over tube amplifiers in terms of bulk, weight and cost, but despite extensive attention being given to the development of transistor amplifiers for many years, there has not been developed a transistor amplifier capable of providing sound reproduction and distortion of comparable quality to a tube amplifier, and for those musicians to whom the characteristics of a tube amplifier are all important, there has been no option than to accept their disadvantages in comparison with transistor amplifiers. Indeed there is currently a great body of opinion in the music industry that it is impossible to produce a transistor amplifier having the sound reproduction and distortion characteristics of a tube amplifier.

By overamplifying a music signal to a high degree, the signal is at first grossly distorted, with the distorted signal finally settling into a normal undistorted region. By doing this, the signal is artificially compressed and the note or chord length is sustained for a greater length of time dependent upon the degree of overamplification. This is generally referred to as the sustaining power of an amplifier. However to achieve the degree of sustaining of a note or chord required by some musicians, the signal quite clearly is grossly distorted for most of the time. Assuming the same degree of overamplification, a transistor amplifier has a harsh non-musical sound due to the distortion products inherent in the electronic devices used and their configuration. In contrast to this, a tube amplifier even with excessive overamplification maintains a warm musical sound. To a lesser degree this situation exists even when overamplification to sustain a note is not used.

Typically in a tube amplifier, a pentode push-pull transformer coupled output stage has a mandatory phase splitter to provide two antiphase signals required for the output tube. These then carry antiphase currents which are summed in the output transformer. The output transformer has the secondary function of matching the low speaker load to the medium impedance anode load required by the output tubes. It is the effect of these components and sections that produce the so-called "tube sound".

Transistor amplifiers in common use have devices and circuitry that have little in common with the tube amplifier and hence produce a different type of distortion and sound.

Attempts to produce a "tube sound" transistor amplifier have embodied circuitry and components to produce a tube sounding signal in advance of the transistor amplifier to be fed to a high quality power amplifier with low distortion products. These attempts have proved unsuccessful because of a failure to recognise the compound effect of sections and components of a tube power amplifier upon the sound.

The object of the present invention is to provide a transistor amplifier that does have the sound and distortion characteristics of a tube power amplifier.

According to the present invention, a transistor amplifier comprises a low powered solid state simulator for a push-pull transformer-coupled tube power amplifier, to allow the production of the overtones and distortion characteristics associated with a tube power amplifier, thereby to produce a tube sound from the transistor amplifier.

Preferably, the solid state devices are field effect transistors. The field effect transistors operate by producing an output current proportional to the input voltage, as distinct from conventionally used bipolar transistors which produce an output current proportional to the input current. Thus, field effect transistors operate in a manner directly comparable to tube, including exhibiting very similar transfer characteristics and consequently similar harmonic products distribution.

It is the realisation that no power output from the simulator is necessary that is a significant part of the present invention, it having been recognised that only a voltage is required for further amplification and subsequent power amplification. Because the sound stage does not require power output, the remaining circuit parameters can be optimised for sound quality instead of having to serve the dual role of providing sound quality and output power.

The invention will now be described with reference to the accompanying drawings, in which.

Figure 1:
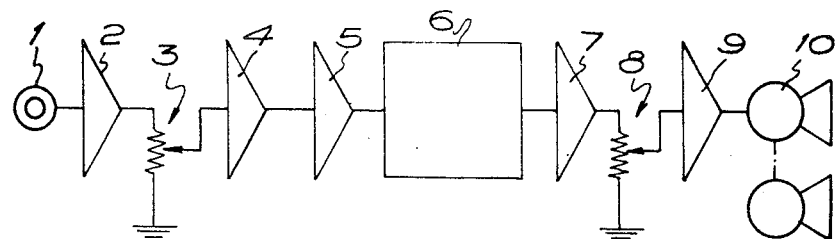
FIG. 1 is a block diagram showing the components of an amplifier from the pick-up on a guitar to a speaker.

The block diagram of FIG. 1 shows the use of a sound simulator within an amplifier configuration that is becoming standard for transistor amplifiers intended to create a tube sound. Thus, a signal from the instrument is fed via a jack input 1 to a low-noise pre-amplifier 2 where the signal is amplified and the treble is boosted. The signal from the pre-amplifier is fed via a gain 3 to the tube sound simulator section 4, the gain 3 being used as the gain control for the sound simulator. The use of the gain 3 allows the simulator section 4 to be driven into gross overload is required.

To avoid overloading, the sound simulator output section 5 is a high impedance buffer circuit. The signal is fed to an equaliser 6 which can boost or cut out selected parts of the audio spectrum. In this way close tolerance over tone control is achieved. The signal is then fed to an equaliser mixer section 7. The totalised signal is then fed to a low distortion high power amplifier 9 via its input gain control 8. The power amplifier 9 feeds one or more speakers 10 suitable for music amplifier reproduction.

Figure 2:
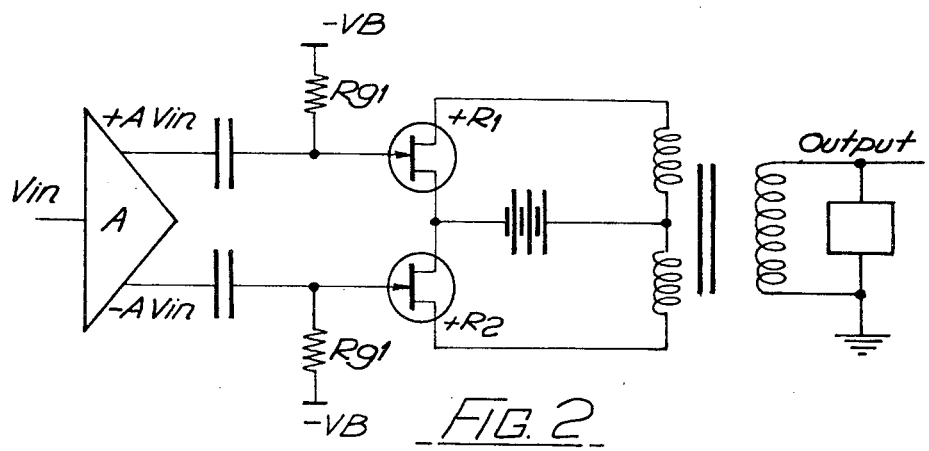
FIG. 2 is a circuit diagram of one embodiment of the sound stage of the amplifier.

One example of a sound simulator section 4 in FIG. 1 is shown in FIG. 2. The section shown as 1 is a phase splitter with gain A providing antiphase outputs to drive the non-complementary output stage transistors $TR_1$, $TR_2$. The output transistors $TR_1$ $TR_2$ are biased by the bias supply $-VB$. The bias current in the output transistors varies according to the class the amplifier operates in. The output signal currents combine in the output transformer to produce the complete signal in the secondary of the transformer.

Figure 3:
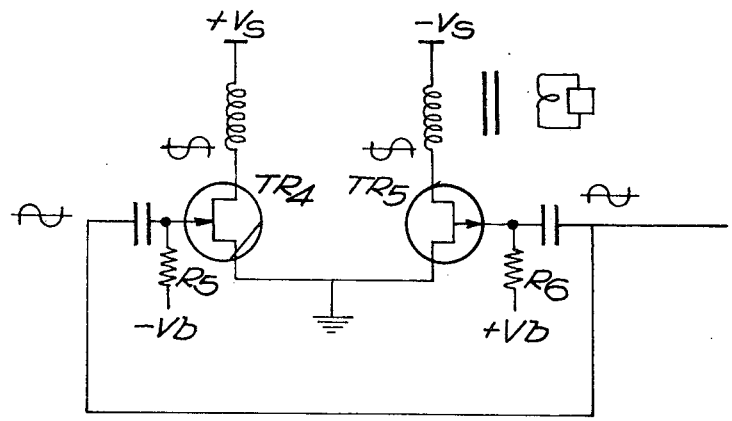
FIG. 3 is a circuit diagram of a second embodiment of the sound stage of the amplifier.

In the alternative shown in FIG. 3, output transistors $TR_3$ and $TR_4$ are of the complementary action type and whereby the same input signal can be used without a phase splitter. The bias voltages and supply voltages are arranged to supply the outputs with their correct polarity supplies. The output transformer is connected such that as with FIG. 2 the two signals are in push-pull relationship and are combined in the transformer to produce a complete signal in the secondary of the transformer.

In both FIGS. 2 and 3, the necessary load connected to the secondary of the transformer can either be resistive or complex. Also, quite obviously, conventional feed-back techniques may be amployed as in any other amplifying circuits.

I claim:

1. A transistor amplifier, comprising:

means for receiving an input electrical signal to be amplified;

low power voltage amplifying means responsive to said input signal for generating a voltage amplified signal, said voltage amplifying means including field effect transistor means for simulating push-pull, transformer coupled vacuum tube amplifier transfer characteristics by push-pull amplifying said input signal;

power amplifier means responsive to said voltage amplified signal to develop a power amplified signal; and means for supplying said power amplified signal to a speaker load.

2. The transistor amplifier of claim 1, wherein said voltage amplifying means includes phase splitter means responsive to said input signal for generating antiphase signals, a series connected pair of like poled field effect transistors having gates thereof responsive respectively to said antiphase signals; means for biasing said field effect transistors; and transformer means for combining and coupling output signals produced by said field effect transistors to said load.

3. The transistor amplifier of claim 1, wherein said voltage amplifying means comprises first and second complementary field effect transistors having common source connections and gates responsive to said input signal; means for biasing said field effect transistors; and transformer means for combining and coupling output signals developed by said field effect transistors to said load.

* * * * *